United States Patent
Ghaedrahmati et al.

(10) Patent No.: US 12,362,756 B2
(45) Date of Patent: Jul. 15, 2025

(54) SUCCESSIVE APPROXIMATION REGISTER ANALOG-TO-DIGITAL CONVERTER

(71) Applicant: Telefonaktiebolaget LM Ericsson (publ), Stockholm (SE)

(72) Inventors: Hanie Ghaedrahmati, Malmö (SE); Lars Sundström, Lund (SE); Mattias Palm, Bara (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 277 days.

(21) Appl. No.: 18/012,444

(22) PCT Filed: Jul. 9, 2020

(86) PCT No.: PCT/EP2020/069448
§ 371 (c)(1),
(2) Date: Dec. 22, 2022

(87) PCT Pub. No.: WO2022/008059
PCT Pub. Date: Jan. 13, 2022

(65) Prior Publication Data
US 2023/0170913 A1 Jun. 1, 2023

(51) Int. Cl.
*H03M 1/06* (2006.01)
*H03M 1/38* (2006.01)

(52) U.S. Cl.
CPC .......... *H03M 1/0604* (2013.01); *H03M 1/38* (2013.01)

(58) Field of Classification Search
CPC ........ H03M 1/0604; H03M 1/08; H03M 1/10; H03M 1/12; H03M 1/38
(Continued)

(56) References Cited

U.S. PATENT DOCUMENTS

| | | |
|---|---|---|
| 6,720,903 B2 | 4/2004 | Confalonieri et al. |
| 6,731,232 B1 | 5/2004 | Kearney |

(Continued)

OTHER PUBLICATIONS

Harpe, P. et al., "An Oversampled 12/14b SAR ADC with Noise Reduction and Linearity Enhancements Achieving up to 79.1dB SNDR", 2014 IEEE International Solid-Sate Circuits Conference, Session 11, Data Converter Techniques/ 11.1, Feb. 11, 2014, pp. 194-196.

(Continued)

*Primary Examiner* — Peguy Jean Pierre
(74) *Attorney, Agent, or Firm* — COATS & BENNETT, PLLC

(57) ABSTRACT

A successive approximation register analog-to-digital converter (SAR ADC) is disclosed, which is configured to receive an analog input signal and provide a digital output signal. The SAR ADC comprises a capacitor bank for successively providing a plurality of signal levels based on a sample value of the analog input signal, wherein each signal level of the plurality is an indicator for a corresponding bit in a corresponding sample of the digital output signal. Furthermore, the SAR ADC comprises controlling circuitry configured to cause the capacitor bank to provide the plurality of signal levels representing a dynamically scaled version of the sample value of the analog input signal. In some embodiments, a respective selector of each capacitor of the capacitor bank is controlled to charge the capacitor using either the sample value of the analog input signal or the sample value of an opposed version of the analog input signal. The setting of the respective selectors corresponds to a digital representation of a scaling value (e.g., a sample value of an oscillator signal) for the dynamically scaled version of the sample value of the analog input signal. Corresponding method, receiver, and wireless communication device are also disclosed.

19 Claims, 5 Drawing Sheets

(58) Field of Classification Search
USPC .................. 341/155, 144, 163, 143, 172, 118
See application file for complete search history.

(56) References Cited

U.S. PATENT DOCUMENTS

| | | |
|---|---|---|
| 2007/0001890 A1 | 1/2007 | Piasecki et al. |
| 2016/0134300 A1* | 5/2016 | Wang .................. H03M 1/42 341/172 |
| 2020/0106454 A1 | 4/2020 | Chang et al. |

OTHER PUBLICATIONS

Banović, K. et al., "A Sub-mW Spectrum Sensing Architecture for Portable IEEE 802.22 Cognitive Radio Applications", IEEE International Symposium on Circuits and Systems, May 28, 2017, pp. 1-4, IEEE.

Sundström, L. et al., "Complex IF Harmonic Rejection Mixer for Non-Contiguous Dual Carrier Reception in 65 nm CMOS", IEEE Journal of Solid-State Circuits, vol. 48, No. 7, Jul. 2013, pp. 1659-1668, IEEE.

Guo, W. et al., "A 12b-ENOB 61µW Noise-Shaping SAR ADC with a Passive Integrator", ESSCIRC Conference 2016: 42nd European Solid-State Circuits Conference, Sep. 12, 2016, pp. 405-408, IEEE.

\* cited by examiner (a)

(b)

(c)

(d)

(a)

(b)

(c)

SUCCESSIVE APPROXIMATION REGISTER ANALOG-TO-DIGITAL CONVERTER

TECHNICAL FIELD

The present disclosure relates generally to the field of successive approximation register analog-to-digital converters (SAR ADCs). More particularly, it relates to mixer implementation in association with a SAR ADC.

BACKGROUND

Many typical radio frequency receivers comprise functionality to down-convert a received radio frequency signal (e.g., by application of mixing) and to perform analog-to-digital conversion of the received radio frequency signal (e.g., by application of a successive approximation register analog-to-digital converter—SAR ADC).

If down-conversion is performed in the digital domain, the analog-to-digital converter (ADC) typically needs to have a relatively large bandwidth, which may entail high ADC complexity and/or inefficient use of the ADC resources (e.g., ADC hardware such as circuitry and/or sub-systems of the ADC) and/or high power consumption.

If down-conversion is performed in the analog domain, the down-converter can be implemented with a harmonic rejection mixer (HRM) or corresponding functionality, which may entail high down-conversion complexity and/or high power consumption.

Therefore, there is a need for alternative approaches for down-conversion and analog-to-digital conversion (e.g., for radio frequency receivers).

SUMMARY

It should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Generally, when an arrangement is referred to herein, it is to be understood as a physical product; e.g., an apparatus. The physical product may comprise one or more parts, such as controlling circuitry in the form of one or more controllers, one or more processors, or the like.

It is an object of some embodiments to solve or mitigate, alleviate, or eliminate at least some of the above or other disadvantages.

A first aspect is a successive approximation register (SAR) analog-to-digital converter (ADC) configured to receive an analog input signal and provide a digital output signal. The SAR ADC comprises a capacitor bank for successively providing a plurality of signal levels based on a sample value of the analog input signal, wherein each signal level of the plurality is an indicator for a corresponding bit in a corresponding sample of the digital output signal. The SAR ADC also comprises controlling circuitry configured to cause the capacitor bank to provide the plurality of signal levels representing a dynamically scaled version of the sample value of the analog input signal.

In some embodiments, the controlling circuitry is configured to dynamically control a respective selector of each capacitor of the capacitor bank to charge the capacitor using either the sample value of the analog input signal or an opposed version of the sample value of the analog input signal.

In some embodiments, a setting of the respective selectors corresponds to a digital representation of a scaling value for the dynamically scaled version of the sample value of the analog input signal.

In some embodiments, each sample of the digital output signal is a quantized representation of the corresponding sample of the dynamically scaled version of the sample value of the analog input signal.

In some embodiments, the dynamically scaled version of the sample value of the analog input signal represents the sample value of the analog input signal multiplied by a sample value of an oscillator signal.

In some embodiments, each sample of the digital output signal is a quantized representation of a corresponding sample of the analog input signal mixed with the oscillator signal.

In some embodiments, the oscillator signal is a sinusoid signal.

In some embodiments, a collection of sample values of the oscillator signal comprises at least three distinct values.

In some embodiments, the SAR ADC further comprises a comparator configured to determine a bit value of the digital output signal based on a corresponding signal level provided by the capacitor bank.

In some embodiments, each capacitor of the capacitor bank has a capacitance which equals a base capacitance multiplied by two to the power of a non-negative integer.

In some embodiments, the capacitors of the capacitor bank have different capacitances, the capacitances including the base capacitance and successively increasing by a factor of two.

In some embodiments, the SAR ADC further comprises an additional capacitor controllable to shift the scaling of the sample value of the analog input signal.

In some embodiments, the controlling circuitry is configured to control a selector of the additional capacitor to charge the additional capacitor using either the sample value of the analog input signal or the opposed version of the sample value of the analog input signal.

In some embodiments, the additional capacitor has the base capacitance.

In some embodiments, the controlling circuitry is configured to cause operation in either a mixing mode or a non-mixing mode, wherein operation in non-mixing mode is caused by application of a static scaling value.

In some embodiments, the SAR ADC comprises first and second capacitor banks configured to successively provide first and second signal levels, wherein the first and second signal levels are differential signal levels for determination of the digital output signal.

In some embodiments, the SAR ADC comprises first and second additional capacitors, wherein the controlling circuitry is configured to control a first selector of the first additional capacitor to charge the first additional capacitor using the sample value of the opposed version of the analog input signal and a second selector of the second additional capacitor to charge the second additional capacitor using the sample value of the analog input signal.

In some embodiments, the SAR ADC further comprises a noise shaping network configured to provide an integration of the signal levels provided by the capacitor bank for adjustment of the digital output signal.

A second aspect is a receiver comprising the SAR ADC of the first aspect.

A third aspect is a wireless communication device comprising the SAR ADC of the first aspect.

A fourth aspect is a method of operating a successive approximation register (SAR) analog-to-digital converter (ADC) configured to receive an analog input signal and provide a digital output signal. The SAR ADC comprises a capacitor bank for successively providing a plurality of signal levels based on a sample value of the analog input signal, wherein each signal level of the plurality is an indicator for a corresponding bit in a corresponding sample of the digital output signal.

The method comprises causing the capacitor bank to provide the plurality of signal levels representing a dynamically scaled version of the sample value of the analog input signal.

In some embodiments, causing the capacitor bank to provide the plurality of signal levels comprises dynamically controlling a respective selector of each capacitor of the capacitor bank to charge the capacitor using either the sample value of the analog input signal or the opposed version of the sample value of the analog input signal.

In some embodiments, causing the capacitor bank to provide the plurality of signal levels comprises setting the respective selectors to correspond to a digital representation of a scaling value for the dynamically scaled version of the sample value of the analog input signal.

In some embodiments, the method further comprises controlling an additional capacitor to shift the scaling of the sample value of the analog input signal.

In some embodiments, the method further comprises configuring operation of the SAR ADC in either a mixing mode or a non-mixing mode, wherein configuring operation in non-mixing mode comprises applying a static scaling value.

In some embodiments, any of the above aspects may additionally have features identical with or corresponding to any of the various features as explained above for any of the other aspects.

An advantage of some embodiments is that alternative approaches are provided for down-conversion and analog-to-digital conversion.

An advantage of some embodiments is that combined down-conversion and analog-to-digital conversion is achieved.

An advantage of some embodiments is that the functionality of a harmonic rejection mixer (HRM) is embedded within a SAR ADC.

An advantage of some embodiments is that the complexity of down-conversion and/or analog-to-digital conversion (i.e., individual complexity and/or combined complexity) is improved (e.g., reduced) compared to other approaches for down-conversion and analog-to-digital conversion.

An advantage of some embodiments is that the power consumption of down-conversion and/or analog-to-digital conversion (i.e., individual complexity and/or combined complexity) is improved (e.g., reduced) compared to other approaches for down-conversion and analog-to-digital conversion.

An advantage of some embodiments is that the ADC resources are more efficiently used compared to other approaches for down-conversion and analog-to-digital conversion.

An advantage of some embodiments is that, since mixing is inherently performed on analog samples so that the ADC functionality acts on down-converted signal material, a noise shaping (NS) functionality may be included for the SAR ADC. Application of NS can reduce the ADC resolution requirement and/or increase the ADC accuracy, compared to other ADC approaches.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

DETAILED DESCRIPTION

Figure 1:
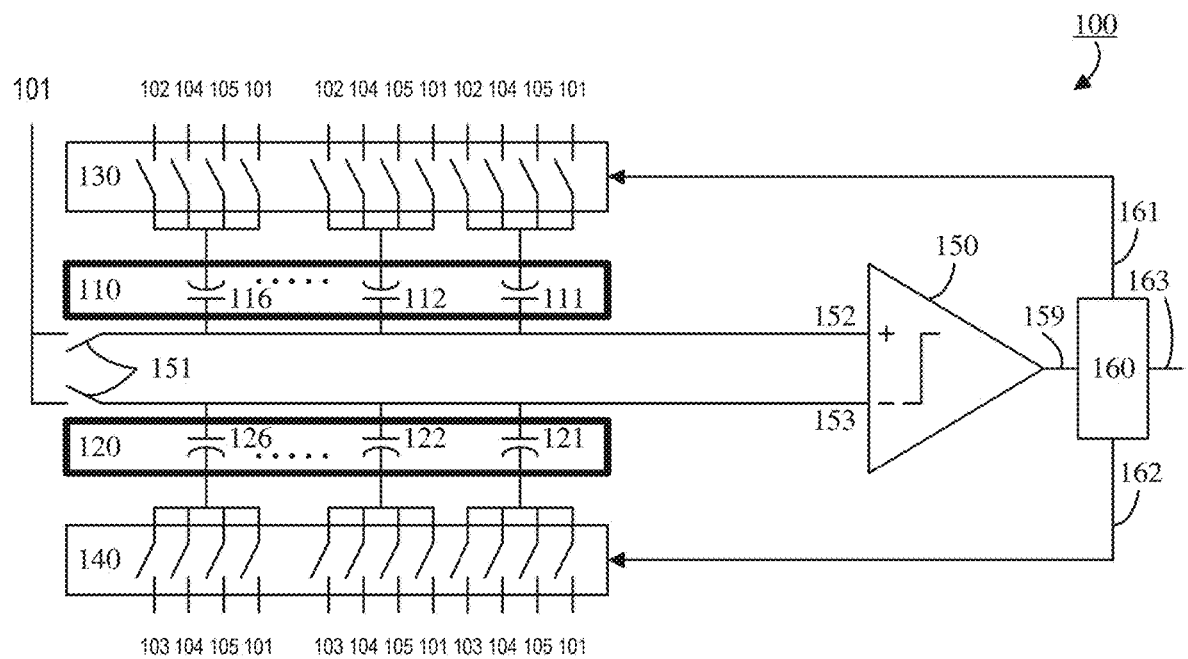
FIG. 1 is a schematic block diagram illustrating an example SAR ADC.

As already mentioned above, it should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

As already mentioned above, typical radio frequency receivers comprise functionality to down-convert a received radio frequency signal and to perform analog-to-digital conversion of the received radio frequency signal.

The analog-to-digital converter (ADC) typically needs to have a relatively large bandwidth when down-conversion is performed in the digital domain.

For example, using a conventional ADC to convert an intermediate frequency (IF) signal may be very inefficient because—since the IF signal typically has a bandwidth which corresponds to a small fraction of the IF frequency—the ADC bandwidth would typically need to have a Nyquist frequency which is much larger than the IF frequency. Furthermore, a conventional ADC would typically provide roughly the same signal-to-noise ratio (SNR) across the entire frequency range up to the Nyquist frequency of the ADC, while only a small fraction of that spectrum is used by the signal under consideration.

When down-conversion is performed in the analog domain, the down-converter typically needs to be a harmonic rejection mixer (HRM) or implement corresponding functionality, which may entail high down-conversion complexity and/or high power consumption.

For example, a HRM may require additional circuitry (buffers and/or amplifiers) for terminating the mixer ports to reach the desired level of harmonic rejection.

In the following, embodiments will be described where alternative approaches are provided for down-conversion and analog-to-digital conversion.

Some embodiments suggest that a SAR ADC (e.g., a noise shaping, NS, ADC) is combined with the HRM function.

Some embodiments are based on the observation that a SAR ADC provides a highly matched system (the capacitive digital-to-analog converter, C-DAC, of the SAR ADC) that can double as an HRM. Thus, the linearity of the C-DAC may be used for HRM functionality as well as for ADC functionality.

In some embodiments, down-conversion and analog-to-digital conversion are combined by manipulation of SAR ADC inputs.

These approaches may have one or more of the following (or other) advantages: relatively low complexity, relatively low power consumption, and efficient use of ADC resources.

Even though embodiments are described herein by exemplification using differential architectures, it should be noted that corresponding non-differential (single-ended) architectures may be equally applicable for some embodiments.

Generally, all switches described herein may be seen as exemplifications of selectors, and it should be noted that a selector may be implemented in other ways than through a switch.

FIG. 1 schematically illustrates an example SAR ADC 100, which may be used as a starting point for exemplification of some embodiments. The example SAR ADC 100 is based on capacitive digital-to-analog converter (C-DAC) technology; a well proven ADC technique that can operate at high sampling rates, is power efficient, and scales well with aggressively scaled complementary metal oxide semiconductor (CMOS) technologies. The variant of C-DAC-based SAR ADC shown in FIG. 1 is based on so-called bottom-plate sampling.

It should be noted that there are various ways to implement a C-DAC-based SAR ADC, all of which may be applicable for some embodiments. Generally, a C-DAC-based SAR ADC has one or more capacitive digital-to-analog converters, each of which comprises a capacitor bank (e.g., an array of capacitors) that doubles as sampling capacitor.

The SAR ADC 100 is configured to receive an analog input signal and provide a digital output signal as is well known in the art.

The signals used by the SAR ADC 100 comprises a common mode voltage signal ($V_{cm}$) 101, the analog input signal ($V_{ip}$) 102 and an opposed version of the analog input signal ($V_{im}$) 103, a first reference voltage signal ($V_{ref\_p}$) 104 and a second reference voltage signal ($V_{ref\_m}$) 105.

Generally, the opposed version of the analog input signal has a voltage that is opposite to that of the analog input signal in relation to a pre-determined voltage level. For example, the opposed version of the analog input signal may be a reversed polarity version of the analog input signal. Alternatively or additionally, the analog input signal and the opposed version of the analog input signal may be centered around $V_{cm}$ (i.e., $V_{ip}=V_{cm}+b$ and $V_{im}=V_{cm}-b$).

Generally, the analog input signal and the opposed version of the analog input signal together form a differential signal.

Generally, the first reference voltage signal has a higher voltage than the second reference voltage signal. For example, the second reference voltage signal may be a reversed polarity version of the first reference voltage signal. Alternatively or additionally, the first and second reference voltage signals may be centered around $V_{cm}$ (i.e., $V_{ref\_p}=V_{cm}+c$ and $V_{ref\_m}=V_{cm}-c$).

Generally, the first and second reference voltage signals together form a differential signal.

The SAR ADC comprises two capacitor banks 110, 120. Typically, each capacitor of the capacitor banks 110, 120 has a capacitance which equals a base capacitance (C) multiplied by two to the power of a non-negative integer (i.e., $2^x C$, $x \in \mathbb{N}$). Also typically, the capacitors of a capacitor bank have different capacitances; including the base capacitance and successively increasing by a factor of two. Thus, the capacitors 111, 112, . . . , 116 of the capacitor bank 110 may have the capacitances C, 2C, . . . , $2^x$C (e.g., C, 2C, . . . , 32C, when the capacitor bank comprises six capacitors; i.e., providing a six-bit ADC), and correspondingly for the capacitors 121, 122, . . . , 126 of the capacitor bank 120.

As is well known in the art, the capacitor banks may be used for successively providing a plurality of (respective) signal levels 152, 153 based on a sample value of the analog input signal, wherein each provided signal level is an indicator for a corresponding bit in a corresponding sample of the digital output signal 163. The SAR ADC 100 comprises a comparator 150 configured to determine a bit value 159 of the digital output signal 163 based on the signal levels 152, 153 provided by the capacitor banks.

The SAR ADC also comprises controlling circuitry (e.g., SAR logic) 160 configured to cause the capacitor banks 110, 120 to provide the plurality of signal levels 152, 153 representing a sample value of the analog input signal. This may be achieved by providing control signals 161, 162 to switching arrays 130, 140, wherein each switching array controls the charging of the capacitors of a corresponding one of the capacitor banks 110, 120.

The SAR ADC 100 is fully differential, so the operation of the two sides (upper and lower part of FIG. 1) are complementary, as will be explained below.

At the sampling phase, the analog input signal 102 is sampled on the capacitor bank 110. This is achieved by connecting the bottom plate (upper capacitor side in FIG. 1) of the capacitors 111, 112, . . . , 116 to $V_{ip}$ 102 and the top plate (lower capacitor side in FIG. 1) of the capacitors 111, 112, . . . , 116 to the common mode voltage signal $V_{cm}$ 101. Connecting the bottom plate of the capacitors 111, 112, . . . , 116 to $V_{ip}$ 102 is achieved by closing—in the switching array 130—the leftmost switch for each of the capacitors 111, 112, . . . , 116 and leaving the other switches of the switching array 130 open. Connecting the top plate of the capacitors 111, 112, . . . , 116 to the common mode voltage signal $V_{cm}$ 101 is achieved by closing the switch 151.

Also at the sampling phase, the opposed version of the analog input signal 103 is sampled on the capacitor bank 120. This is achieved by connecting the bottom plate (lower capacitor side in FIG. 1) of the capacitors 121, 122, . . . , 126 to $V_{im}$ 103 and the top plate (upper capacitor side in FIG. 1) of the capacitors 121, 122, . . . , 126 to the common mode voltage signal $V_{cm}$ 101. Connecting the bottom plate of the capacitors 121, 122, . . . , 126 to $V_{im}$ 103 is achieved by closing—in the switching array 140—the leftmost switch for each of the capacitors 121, 122, . . . , 116 and leaving the other switches of the switching array 140 open. Connecting the top plate of the capacitors 121, 122, . . . , 126 to the common mode voltage signal $V_{cm}$ 101 is achieved by closing the switch 151.

In a following stage (conversion phase), the bottom plate of the capacitors 111, 112, . . . , 116 are switched to $V_{cm}$ 101 while the top plates are disconnected from $V_{cm}$ 101. Connecting the bottom plate of the capacitors 111, 112, . . . , 116 to $V_{cm}$ 101 is achieved by closing—in the switching array 130—the rightmost switch for each of the capacitors 111, 112, . . . , 116 and leaving the other switches of the switching array 130 open. Disconnecting the top plate of the capacitors 111, 112, . . . , 116 from $V_{cm}$ 101 is achieved by opening the switch 151. Thereby, the analog input signal sample is applied to the comparator input, resulting in a voltage $V_{cm}-b=2V_{cm}-V_{ip}$ at the positive input 152 of the comparator when $V_{ip}=V_{cm}+b$.

Also in the following stage, the bottom plate of the capacitors 121, 122, . . . , 126 are switched to $V_{cm}$ 101 while the top plates are disconnected from $V_{cm}$ 101. Connecting the bottom plate of the capacitors 121, 122, . . . , 126 to $V_{cm}$ 101 is achieved by closing—in the switching array 140—the rightmost switch for each of the capacitors 121, 122, . . . , 126 and leaving the other switches of the switching array 140 open. Disconnecting the top plate of the capacitors 121, 122, . . . , 126 from $V_{cm}$ 101 is achieved by opening the switch 151. Thereby, the opposed version of the analog input signal sample is applied to the comparator input, resulting in a voltage $V_{cm}+b=2V_{cm}-V_{im}$ at the negative input 153 of the comparator when $V_{im}=V_{cm}-b$.

Then, the comparator 150 is triggered and outputs a decision 159 based on the differential input 152, 153. Typically, the decision is a bit decision. The bit decision may be "1" when the differential input is positive, and the bit decision may be "0" when the differential input is negative (a differential input of zero may be mapped to either "0" or "1" in various implementations). The first comparator decision for an analog input signal sample may correspond to a most significant bit (MSB) for a digital representation 163 of the analog input signal sample value.

After each comparator decision, the bottom plate of one of the capacitors 111, 112, . . . , 116 are switched to either $V_{ref\_p}$ 104 or $V_{ref\_m}$ 105 while the top plates stay disconnected from $V_{cm}$ 101. Connecting the bottom plate of one of the capacitors 111, 112, . . . , 116 to either $V_{ref\_p}$ 104 or $V_{ref\_m}$ 105 is achieved by closing—in the switching array 130—the third or second switch from the right for the relevant one of the capacitors 111, 112, . . . , 116 and leaving the other switches of the switching array 130 open. Thereby, the voltage manifested at the positive input 152 of the comparator is changed accordingly.

Correspondingly after each comparator decision, the bottom plate of one of the capacitors 121, 122, . . . , 126 are switched to either $V_{ref\_m}$ 105 or $V_{ref\_p}$ 104 while the top plates stay disconnected from $V_{cm}$ 101. Connecting the bottom plate of one of the capacitors 121, 122, . . . , 126 to either $V_{ref\_m}$ 105 or $V_{ref\_p}$ 104 is achieved by closing—in the switching array 140—the third or second switch from the left for the relevant one of the capacitors 121, 122, . . . , 126 and leaving the other switches of the switching array 140 open. Thereby, the voltage manifested at the negative input 153 of the comparator is changed accordingly.

Thus, the differential input of the comparator 150 has changed, and the comparator 150 is triggered again and outputs a new decision 159 based on the differential input 152, 153. The second comparator decision for an analog input signal sample may correspond to the bit following the MSB (i.e., MSB-1) for a digital representation 163 of the analog input signal sample value.

The process of alternatingly connecting bottom plate(s) of relevant capacitor(s) to $V_{ref\_m}$ or $V_{ref\_p}$ and triggering the comparator to take a decision is iterated until a last decision has been taken for the analog input signal sample; typically corresponding to a least significant bit (LSB) for a digital representation 163 of the analog input signal sample value. Then, the capacitor banks may be reset and a new sample of the analog input signal may be loaded for processing.

Figure 2:
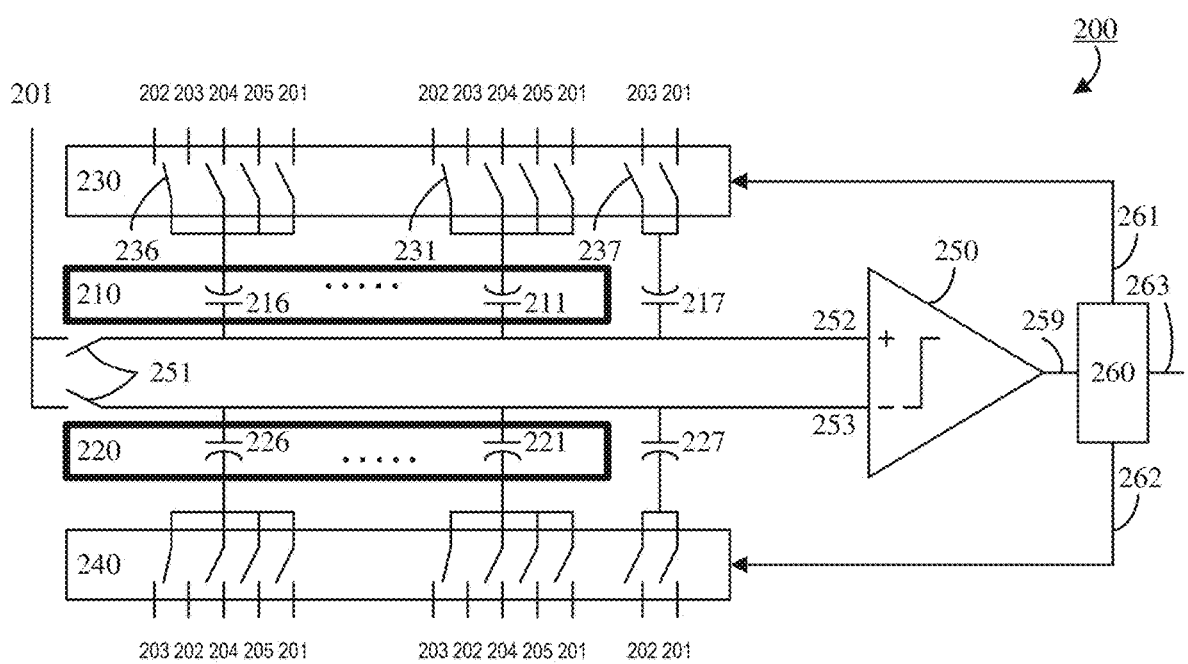
FIG. 2 is a schematic block diagram illustrating an example SAR ADC according to some embodiments.

FIG. 2 schematically illustrates an example SAR ADC 200 according to some embodiments, which is based on the SAR ADC 100 of FIG. 1.

In similarity with FIG. 1, the SAR ADC 200 is configured to receive an analog input signal and provide a digital output signal. However, while the SAR ADC 100 of FIG. 1 was configured to provide the digital output signal 163 as a sampled and quantized representation of the analog input signal, the SAR ADC 200 is configured to provide—for each sample of the analog input signal—the digital output signal as a quantized representation of a scaled version of the analog input signal sample. Thus, each sample of the digital output signal is a quantized representation of the corresponding sample of the dynamically scaled version of the sample value of the analog input signal.

The scaling is achieved by a modification and control of the switching arrays, as elaborated on in the following.

By dynamically controlling the scaling and selection of suitable scaling values, the SAR ADC 200 may be configured to provide the digital output signal as a sampled and quantized representation of an analog input signal mixed with an oscillator signal. Thus, a mixing functionality is embedded in the SAR ADC 200.

In similarity with FIG. 1, the signals used by the SAR ADC 200 comprises a common mode voltage signal ($V_{cm}$) 201, the analog input signal ($V_{ip}$) 202 and an opposed version of the analog input signal ($V_{im}$) 203, a first reference voltage signal ($V_{ref\_p}$) 204 and a second reference voltage signal ($V_{ref\_m}$) 205.

Also in similarity with FIG. 1, the SAR ADC 200 comprises two capacitor banks 210, 220. The capacitor banks 210, 220 are completely corresponding to the capacitor banks 110, 120 of FIG. 1. Thus, the capacitors 211, . . . , 216 of the capacitor bank 210 may have the capacitances C, 2C, . . . , $2^xC$, and correspondingly for the capacitors 221, . . . , 226 of the capacitor bank 220.

The SAR ADC 200 is fully differential, so the operation of the two sides (upper and lower part of FIG. 2) are complementary, similarly to the previous explanation in connection with FIG. 1.

Also in similarity with FIG. 1, the SAR ADC 200 comprises a comparator 250 configured to determine a bit value 259 of the digital output signal 263 based on the signal levels 252, 253 provided by the capacitor banks.

Further in similarity with FIG. 1, the SAR ADC 200 also comprises controlling circuitry 260 configured to cause the capacitor banks 210, 220 to provide a plurality of signal levels based on the analog input signal. In contrast to FIG. 1, the controlling circuitry 260 is configured to cause the capacitor banks 210, 220 to provide the plurality of signal levels representing a dynamically scaled version of the sample value of the analog input signal.

This may be achieved by providing control signals 261, 262 to switching arrays 230, 240, wherein each switching array controls the charging of the capacitors of a corresponding one of the capacitor banks 210, 220. Notably, the switching arrays 230, 240 differ from the switching arrays of FIG. 1 in that the leftmost switch 231, . . . , 236 for each of the capacitors 211, . . . , 216; 221, . . . , 226 is operable to supply either of the analog input signal ($V_{ip}$) 202 and the opposed version of the analog input signal ($V_{im}$) 203 to its corresponding capacitor.

The scaling of the sample value of the analog input signal is achieved by letting a digital representation of a scaling values control—at the sampling phase—the positions of the leftmost switches for each of the capacitors.

For example, if the scaling value s can be represented as 111111, all of the switches 231, . . . , 236 may be set such that the bottom plate of all of the capacitors 211, . . . , 216 is connected to $V_{ip}$ 202, and all of the corresponding switches in the switching array 240 may be set such that the bottom plate of all of the capacitors 221, . . . , 226 is connected to $V_{im}$ 203.

Then, if the scaling value s can be represented as 111110, the switches 231, . . . , 236 may be set such that the bottom plate of all of the capacitors 211, . . . , 216 is connected to $V_{ip}$ 202 except for the capacitor 211 which is connected to $V_{im}$ 203, and all of the corresponding switches in the switching array 240 may be set such that the bottom plate of all of the capacitors 221, . . . , 226 is connected to $V_{im}$ 203, except for the capacitor 221 which is connected to $V_{ip}$ 202.

Corresponding settings for the switching arrays may be applicable for other scaling value representations.

Thus, the controlling circuitry 260 is configured to control a respective selector (e.g., switches 231, . . . , 236) of each capacitor of the capacitor banks to charge the capacitor using either the sample value of the analog input signal $V_{ip}$ 202 or the sample value of the opposed version of the analog input signal $V_{im}$ 203, such that a setting of the respective selectors corresponds to a digital representation of the scaling value s for the sample value of the analog input signal.

In some embodiments, the scaling values are selected as digital representations of samples of an oscillator signal (e.g., a sinusoid signal). Typically, the sampling times correspond to sampling times of the analog input signal. Preferably, the oscillator signal has a frequency which satisfies the Nyquist limit in relation to the sampling frequency (i.e., a collection of sample values of the oscillator signal comprises at least three distinct values).

Then, the dynamically scaled version of the sample value of the analog input signal represents a sample of the analog input signal multiplied by a sample value of the oscillator signal; thereby providing mixing of the analog input signal with the oscillator signal. Thus, each sample of the digital output signal is a quantized representation of a corresponding sample of the analog input signal mixed with the oscillator signal. It may be noted that the mixing functionality is applied for analog domain samples (before quantization), which might be beneficial for the accuracy of the mixing operation.

At the sampling phase, the dynamically scaled version of the analog input signal is sampled on the capacitor bank 210. This is achieved by connecting the bottom plate (upper capacitor side in FIG. 2) of the capacitors 211, . . . , 216 to either $V_{ip}$ 202 or $V_{im}$ 203—depending on the applicable scaling value—and the top plate (lower capacitor side in FIG. 2) of the capacitors 211, . . . , 216 to the common mode voltage signal $V_{cm}$ 201. Connecting the bottom plate of the capacitors 211, . . . , 216 to either $V_{ip}$ 202 or $V_{im}$ 203 is achieved by controlling the positions of switches 231, . . . , 236 for each of the capacitors 211, . . . , 216 and leaving the other switches of the switching array 230 open. Connecting the top plate of the capacitors 211, . . . , 216 to the common mode voltage signal $V_{cm}$ 201 is achieved by closing the switch 251.

Also at the sampling phase, the dynamically scaled version of the opposed version of the analog input signal is sampled on the capacitor bank 220. This is achieved by connecting the bottom plate (lower capacitor side in FIG. 2) of the capacitors 221, . . . , 226 to either $V_{ip}$ 202 or $V_{im}$ 203—depending on the applicable scaling value (flipping the polarity for each capacitor compared to the capacitor bank 210)— and the top plate (upper capacitor side in FIG. 2) of the capacitors 221, . . . , 226 to the common mode voltage signal $V_{cm}$ 201. Connecting the bottom plate of the capacitors 221, . . . , 226 to either $V_{ip}$ 202 or $V_{im}$ 203 is achieved by controlling—in the switching array 240—the position of the leftmost switch for each of the capacitors 221, . . . , 226 and leaving the other switches of the switching array 240 open. Connecting the top plate of the capacitors 221, . . . , 226 to the common mode voltage signal $V_{cm}$ 201 is achieved by closing the switch 251.

In a following stage (conversion phase), the bottom plate of the capacitors 211, . . . , 216 are switched to $V_{cm}$ 201 while the top plates are disconnected from $V_{cm}$ 201. Connecting the bottom plate of the capacitors 211, . . . , 216 to $V_{cm}$ 201 is achieved by closing—in the switching array 230—the rightmost switch for each of the capacitors 211, . . . , 216 and leaving the other switches of the switching array 230 open. Disconnecting the top plate of the capacitors 211, . . . , 216 from $V_{cm}$ 201 is achieved by opening the switch 251. Thereby, the scaled analog input signal sample is applied to the comparator input, resulting in a voltage $V_{cm}-sb=V_{cm}-s(V_{ip}-V_{cm})$ at the positive input 252 of the comparator when $V_{ip}=V_{cm}+b$.

Also in the following stage, the bottom plate of the capacitors 221, . . . , 226 are switched to $V_{cm}$ 201 while the top plates are disconnected from $V_{cm}$ 201. Connecting the bottom plate of the capacitors 221, . . . , 226 to $V_{cm}$ 201 is achieved by closing—in the switching array 240—the rightmost switch for each of the capacitors 221, . . . , 226 and leaving the other switches of the switching array 240 open. Disconnecting the top plate of the capacitors 211, . . . , 216 from $V_{cm}$ 201 is achieved by opening the switch 251. Thereby, the scaled opposed version of the analog input signal sample is applied to the comparator input, resulting in a voltage $V_{cm}+sb=-S(V_{im}-V_{cm})$ at the negative input 253 of the comparator when $V_{im}=V_{cm}-b$.

Then, the comparator 250 is triggered and outputs a decision 259 based on the differential input 252, 253, in the same manner as explained above in connection with FIG. 1.

After each comparator decision, the bottom plate of one of the capacitors 211, . . . , 216 are switched to either $V_{ref\_p}$ 204 or $V_{ref\_m}$ 205 while the top plates stay disconnected from $V_{cm}$ 201. Connecting the bottom plate of one of the capacitors 211, . . . , 216 to either $V_{ref\_p}$ 204 or $V_{ref\_m}$ 205 is achieved by closing—in the switching array 230—the third or second switch from the right for the relevant one of the capacitors 211, . . . , 216 and leaving the other switches of the switching array 230 open. Thereby, the voltage manifested at the positive input 252 of the comparator is changed accordingly.

Correspondingly after each comparator decision, the bottom plate of one of the capacitors 221, . . . , 226 are switched to either $V_{ref\_m}$ 205 or $V_{ref\_p}$ 204 while the top plates stay disconnected from $V_{cm}$ 201. Connecting the bottom plate of one of the capacitors 221, . . . , 226 to either $V_{ref\_m}$ 205 or $V_{ref\_p}$ 204 is achieved by closing—in the switching array 240—the third or second switch from the left for the relevant one of the capacitors 221, . . . , 226 and leaving the other switches of the switching array 240 open. Thereby, the voltage manifested at the negative input 153 of the comparator is changed accordingly.

Then, the comparator 250 is triggered again and outputs a new decision 259 based on the differential input 252, 253, and the process of alternatingly connecting bottom plate(s) of relevant capacitor(s) to $V_{ref\_m}$ or $V_{ref\_p}$ and triggering the comparator to take a decision is iterated until a last decision has been taken for the analog input signal sample, in the same manner as explained above in connection with FIG. 1. Then, the capacitor banks may be reset and a new dynamically scaled sample of the analog input signal may be loaded for processing.

If it is desirable to be able to represent a zero-valued dynamically scaled sample of the analog input signal (i.e., scaling value and/or analog input signal sample value equal to zero), one suitable approach comprises using an additional capacitor 217, 227 for each of the capacitor banks 210, 220. Typically, each of the additional capacitors 217, 227 has the base capacitance (C) of the corresponding capacitor bank.

A purpose of the additional capacitors is to shift the quantization levels of the scaling (e.g., by shifting the grid of quantization levels) such that a particular quantization level represents the zero-valued dynamically scaled sample of the analog input signal. This may be achieved by controlling the additional capacitors 217, 227 such that they bias (i.e., shift) the scaling of the sample value of the analog input signal.

At the sampling phase, $V_{im}$ 203 is sampled on the additional capacitor 217 and $V_{ip}$ 202 is sampled on the additional capacitor 227. This is achieved by connecting the bottom plate (upper capacitor side in FIG. 2) of the capacitor 217 to $V_{im}$ 203 and the top plate (lower capacitor side in FIG. 2) of the capacitor 217 to the common mode voltage signal $V_{cm}$ 201, and by connecting the bottom plate (lower capacitor side in FIG. 2) of the capacitor 227 to $V_{ip}$ 202 and the top plate (upper capacitor side in FIG. 2) of the capacitor 227 to the common mode voltage signal $V_{cm}$ 201. Connecting the bottom plate of the capacitors 217, 227 to $V_{im}$ 203 and $V_{ip}$ 202, respectively, is achieved by closing the switch 237 for the capacitor 217 (and correspondingly for the capacitor 227), and leaving the other switches for the capacitors 217, 227 open. Connecting the top plate of the capacitors 217, 227 to the common mode voltage signal $V_{cm}$ 201 is achieved by closing the switch 251.

Thus, the controlling circuitry is configured to control selectors (e.g., switches 237) of the additional capacitors to charge the additional capacitors 217, 227 using either the sample value of the analog input signal $V_{ip}$ 202 or the sample value of the opposed version of the analog input signal $V_{im}$ 203.

During the following stages (conversion phase; alternatingly connecting bottom plate(s) of relevant capacitor(s) of the capacitor banks to $V_{ref\_m}$ or $V_{ref\_p}$ and triggering the comparator to take a decision), the bottom plate of the capacitors 217, 227 are switched to $V_{cm}$ 201 while the top plates are disconnected from $V_{cm}$ 201. Connecting the bottom plate of the capacitors 217, 227 to $V_{cm}$ 201 is achieved by closing the rightmost switch for each of the capacitors 217, 227 and leaving the other switches of the capacitors 217, 227 open. Disconnecting the top plate of the capacitors 217, 227 from $V_{cm}$ 201 is achieved by opening the switch 251.

By application of the additional capacitors as described above, the voltage at the positive input 252 of the comparator becomes $V_{cm}-(s-\beta)(V_{ip}-V_{cm})$ instead of $V_{cm}-s(V_{ip}-V_{cm})$ for the first readout (MSB), and the voltage at the negative input 253 of the comparator becomes $V_{cm}-(s-\beta)(V_{im}-V_{cm})$ instead of $V_{cm}-s(V_{cm}-V_{cm})$. Thus, the scaling used for providing the signal levels 252, 253 to the comparator 250 are shifted, and the differential input to the comparator is changed by $2\beta(V_{ip}-V_{im})$, which enables inclusion of a zero-values sample among the quantization levels.

The parameter is proportional to the size of the additional capacitors 217, 227. For example, for a N-bit binary-scaled SAR ADC, the parameter may be defined as $\beta=\alpha/2^N$, where $\alpha$ represents a proportionality constant.

For example, a scaling value of +24 may be represented by 101100 (assuming a 6-bit ADC), the switches 236, . . . , 231 are connected—respectively—to 202, 203, 202, 202, 203, 203 and the charge of the capacitors 216, . . . , 211 and the additional capacitor 217 will correspond to $44V_{ip}+19V_{im}+V_{im}=24V_{ip}$, for $V_{im}=-V_{ip}$, where $44V_{ip}$ is due to the capacitors connected to 202, $19V_{im}$ is due to the capacitors connected to 203, and $V_{im}$ is due to the additional capacitor.

Thus, according to some embodiments, one or more additional capacitor is introduced with reduced switching capabilities compared to the capacitors of the capacitor bank(s), which are used as both sampling capacitors and DAC capacitors.

It should be noted that the additional capacitors 217, 227 are optional and may not be present according to some embodiments.

In some embodiments, the SAR ADC 200 may be operable in either a mixing mode or a non-mixing mode. The mixing mode may be achieved by operating the SAR ADC as described above, while the non-mixing mode may be achieved by application of a static (i.e., non-dynamic, not differing between samples) scaling value.

If there are additional capacitors 217, 227, the non-mixing mode may comprise leaving them in operation to shift the scaling of the sample value of the analog input signal, as described above, or the non-mixing mode may comprise statically (i.e., at the sampling phase as well as during the conversion phase) connecting the bottom plate of the capacitors 217, 227 to $V_{cm}$ 201. Connecting the bottom plate of the capacitors 217, 227 to $V_{cm}$ 201 is achieved by closing the rightmost switch for each of the capacitors 217, 227 and leaving the other switches of the capacitors 217, 227 open.

Thus, according to some embodiments, the C-DAC weights of a SAR ADC, which are typically designed to be well matched, are reused for performing harmonic rejection mixing as part of the sampling phase of the SAR ADC. Different mixing frequencies may be obtained by changing the oversampling rate of the equivalent oscillator frequency and/or by changing the sampling rate of the SAR ADC.

Additional capacitor(s) may be added for activation during sampling, according to some embodiments. The additional capacitor(s) are not used in the conversion phase. The additional capacitor(s) shift the grid of quantization levels, which may, for example, be used to enable a suitable representation of a sinusoidal sampling gain sequence to ensure efficient harmonic rejection.

Combining the technique according to some embodiments with noise shaping in the SAR ADC may further improve the effective resolution without addition of more cycles in the SAR ADC conversion phase.

Figure 3:
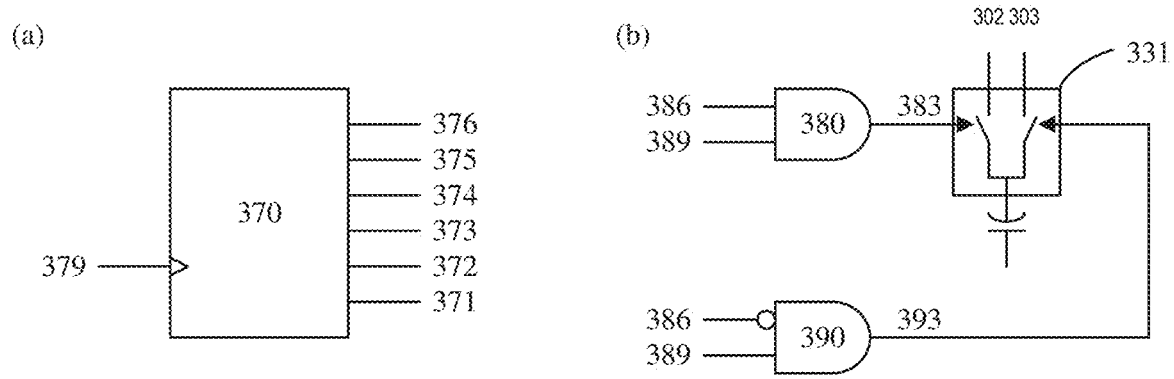
FIG. 3 is a collection of schematic block diagrams illustrating example control signal generators according to some embodiments.

FIG. 3 schematically illustrates some example control signal generators according to some embodiments.

In part (a) of FIG. 3, a binary code generator 370 is presented with control signal outputs 371, 372, 373, 374, 375, 376, which output a collection of bits when trigged by a sampling signal 379. The collection of bits of 371, 372, 373, 374, 375, 376 may correspond to the scaling value and may be used for controlling the position of switches 231, . . . , 236 (and correspondingly for the switching array 240) at the sampling phase. For example, the bit of 371 may control the switch 231, and the bit of 376 may be used to control the switch 236; and correspondingly for the bits and switches there between. If a capacitor bank has another number of capacitors than six, the size of the collection of bits (i.e., the number of control signals 371, . . . , 376) may be adjusted accordingly.

In part (b) of FIG. 3, a possible implementation of using a scaling bit 386 (e.g., a bit from any of the outputs 371, 372, 373, 374, 375, 376) to control a corresponding one of the switches 231, . . . , 236 of the switching array 230, represented by the switch 331 in part (b) of FIG. 3.

When the value of the scaling bit 386 is "0" and the AND-gates 380, 390 are triggered by the sampling signal 389, the output 383 of the AND-gate 380 is "0" and the output 393 of the AND-gate 390 is "1". Thereby, the switch 331 is disconnected from the analog input signal $V_{ip}$ 302 and connected to the opposed version of the analog input signal $V_{im}$ 303.

When the value of the scaling bit 386 is "1" and the AND-gates 380, 390 are triggered by the sampling signal 389, the output 383 of the AND-gate 380 is "1" and the output 393 of the AND-gate 390 is "0". Thereby, the switch 331 is connected to the analog input signal $V_{ip}$ 302 and disconnected from the opposed version of the analog input signal $V_{im}$ 303.

To control the switches of switching array 240, the corresponding arrangement may be used with 302 and 303 interchanged (or—equivalently—with 380 and 390 interchanged).

Thus, the control signals 371, . . . , 376 may be used to connect each capacitor of the capacitor bank(s) to either of the analog input signal and the opposed version of the analog input signal by gating an asynchronous sampling signal 389 (which may, for example, come from the SAR logic 260) and the binary codes which are generated by a binary code generator block 370.

Figure 4:
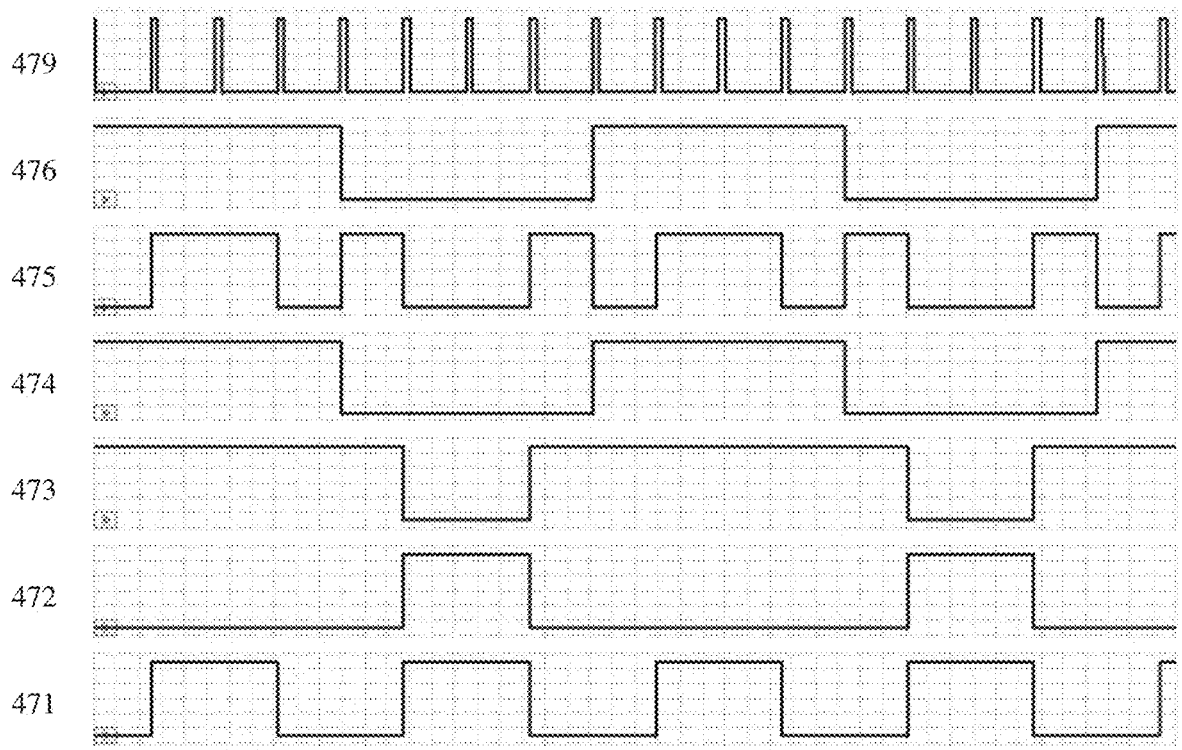
FIG. 4 is a signal plot illustrating example control signals according to some embodiments.

FIG. 4 illustrates example control signals according to some embodiments, in the form of a timing diagram. The signal 479 represents a sampling signal (compare with the sampling signal 379, 389 of FIG. 3). The signals 471, 472, 473, 474, 475, 476 may represent a dynamically changing scaling value and may be used for controlling the position of switches 231, . . . , 236 (and correspondingly for the switching array 240) at the sampling phase. The signals 471, 472, 473, 474, 475, 476 may, for example, correspond to the collection of bits 371, 372, 373, 374, 375, 376 in part (a) of FIG. 3. If a capacitor bank has another number of capacitors than six, the number of signals 471, . . . , 476 may be adjusted accordingly. The particular example illustrated in FIG. 4 corresponds to the following scaling values (e.g., sample values of a sinusoid signal):

| Scaling value | bit pattern (376, . . . , 371) |
|---|---|
| 24 | 101100 |
| 58 | 111101 |
| 58 | 111101 |
| 24 | 101100 |
| −24 | 010100 |
| −58 | 000011 |

-continued

| Scaling value | bit pattern (376, . . . , 371) |
|---|---|
| −58 | 000011 |
| −24 | 010100 |

The scaling values of the table above exemplify a sampling gain varying in relation to a sinusoid signal (e.g., a local oscillator, LO, signal) with frequency $f_{LO}$ and sampled $N_s$ times per period (i.e., a sampling frequency of $f_{LO}N_s$; equal to the sampling rate of the SAR ADC). The ideal scaling values $$a_k = G \sin\left(\frac{2\pi k}{N_s} + \varphi\right).$$

where v is largest coefficient value are quantized to the scaling values of the above table (i.e., possible scaling values are restricted by the sampling gain levels available from the capacitor array in the SAR ADC). To find quantized scaling values suitable for providing efficient harmonic rejection, both φ and G may be swept in search for configurations that fulfill HR requirements under consideration.

By applying the scaling values to the SAR ADC input signal as explained above (e.g., in a discrete time sequence synchronously aligned with the SAR ADC sampling), a frequency translation $f_{LO}$ of the SAR ADC input signal is synthesized.

Figure 5:
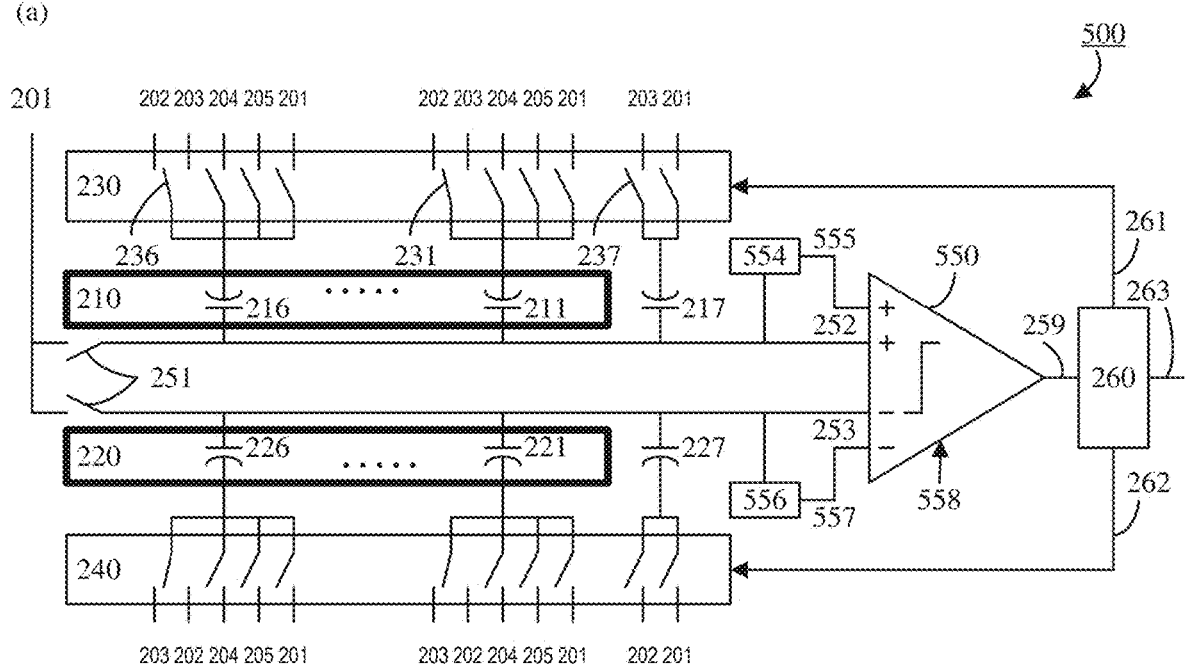
FIG. 5 is a collection of schematic block diagrams and a signal plot illustrating an example SAR ADC and corresponding noise shaping principles according to some embodiments.
Figure 5:
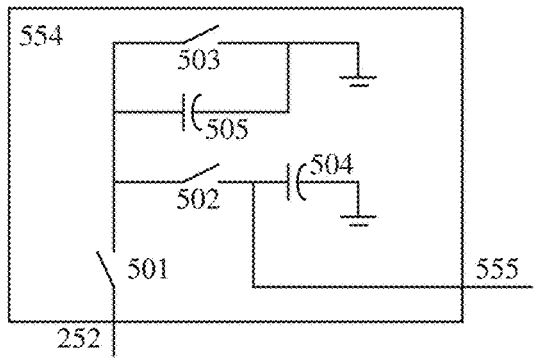
Figure 5:
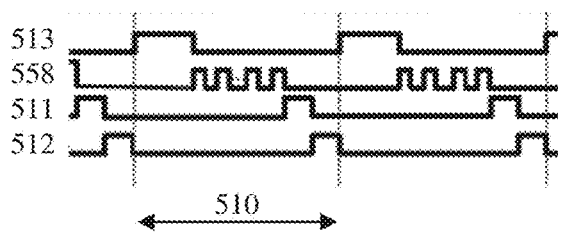
Figure 5:
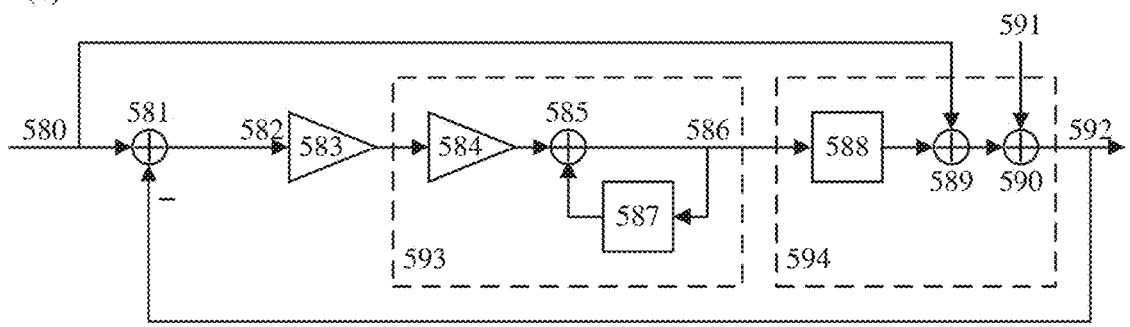

FIG. 5 schematically illustrates an example SAR ADC 500 according to some embodiments, which is based on the SAR ADC 200 of FIG. 2.

Part (a) of FIG. 5 illustrates an overview of the SAR ADC 500. Reference numbers of FIG. 5 that have corresponding reference numbers in FIG. 2 are not elaborated on further. It should be understood that the description in connection with FIG. 2 of the features corresponding to such reference numbers is applicable for FIG. 5 as well.

In contrast to FIG. 2, the SAR ADC 500 comprises noise shaping networks 554, 556 configured to provide an integration 555, 557 of the signal levels 252, 253 provided by the capacitor bank 210, 220. The integration is provided for adjustment of the digital output signal 263.

The SAR ADC 500 comprises a comparator 550 configured to determine a bit value 259 of the digital output signal 263 based on the signal levels 252, 253 provided by the capacitor banks 210, 220; but also based on the integrations 555, 557 provided by the noise shaping networks 554, 556.

Part (b) of FIG. 5 illustrates one example implementation of the noise shaping network 554. The other noise shaping network 556 may be implemented in a corresponding manner. Part (c) of FIG. 5 shows a timing diagram comprising a sampling signal 513 (compare with sampling signals 379, 389 of FIG. 3 and 479 of FIG. 4) with period 510, a comparator trigger signal 558, and control signals 511, 512 for the switches 501, 502 of the noise shaping networks 554.

A sampling period starts with the operation as described for a sample in connection with FIG. 2. The switch 503 is controlled by the sampling signal 513 and is closed at the sampling phase. This will discharge the capacitor 505.

After the conversion cycles, indicated by the multiple pulses of the comparator trigger signal 558, a residue voltage $V_{res}$ remains in the capacitor bank 210. The switch 501 is subsequently closed as illustrated by 511. While 501 is closed, the capacitor 505 with capacitance $C_{NS1}$ is connected to 252 and is charged by the capacitor bank 210, with an overall capacitance $C_{bank}$. When the switch 501 is opened again, the capacitor 505 will have a charge corresponding to a voltage of $V_{res} C_{bank}/(C_{NS1}+C_{bank})$.

Thereafter, the switch 502 is closed as illustrated by 512, and the capacitor 505 dumps its charge onto the capacitor 504 with capacitance $C_{NS2}$, effectively realizing a passive integration. The voltage $V_{int}$ integrated on the capacitor 504 is fed to the comparator 550 as illustrated by 555, and is used by the comparator 550 during bit-conversion of the next sample.

The use of $V_{int}$ by the comparator 550 may be in accordance with any suitable approach. For example, compensation may be performed by designing the amplifying stage of the comparator inputs receiving the signal 555, 557 to have different (e.g., larger) gain than the amplifying stage of the comparator inputs receiving the signal 252, 253. Such differing gain may be implemented by sizing the input transistors of the comparator 550. Alternatively or additionally, dynamic or passive gain enhancing circuit(s) may be used in input paths 555, 557.

Thus, the comparator 550 has two input types; one input type 252, 253 connectable (e.g., connected) to the capacitor banks as described in connection with FIG. 2, and another input type connectable (e.g., connected) to the noise shaping networks 554, 556 for receiving the integrations 555, 557.

A limitation with passive integration that only a fraction of $V_{res}$ is integrated on the capacitor 504 (i.e., the capacitor 504 carries an integrated and attenuated version of $V_{res}$) This attenuation K may be compensated for (e.g., by considering a relative gain between $V_{int}$ and the voltage of 252, 253 when input transistors of the comparator 550 are dimensioned, as indicated above).

Part (d) of FIG. 5 illustrates a functional representation of the operation of the noise shaping networks 554, 556 combined with the comparator 550. The signal levels 252, 253 provided by the capacitor banks are represented by $V_{input}$ 580 and the ADC output is represented by $D_{out}$ 592.

Studying the functional representation of part (d) of FIG. 5 in z-domain, the ADC output $D_{out}(z)$ 592 is subtracted from the input $V_{input}(z)$ 580 by the adder 581. While switch 501 is closed, the output $V_{res}(z)$ 582 of the adder 581 is amplified by (1−a) in amplifier 583.

While switch 502 is closed, the passive integrator 593 amplifies the output of amplifier 583 by a in amplifier 584 and then input to an adder 585, which also receives the adder output 586 passed through the feedback block 587 which implements $(1-a)z^{-1}$.

The output $V_{int}(z)$ 586 of the passive integrator 593 enters a 2-path comparator 594 together with the input $V_{input}(z)$ 580. The output $V_{int}(z)$ 586 of the passive integrator 593 is passed through the block 588 which implements $KZ^{-1}$, and then added to the input $V_{input}(z)$ 580 in adder 589. The result is added to the quantization noise Q(z) 591 in adder 590 and provided as the ADC output $D_{out}(z)$ 592.

The output 592 is a result of quantizing the input voltage 580 and previous sample of $V_{int}$, which can be written as $$D_{out}(z)=V_{input}(z)+Q(z)+KZ^{-1}V_{int}(Z),$$

where $D_{out}$ is the ADC output after bit conversion and before closing the noise shaping loop, and Q(z) represents the quantization noise of the ADC before noise shaping.

While switch 501 is closed, the capacitor 505 is loaded as $$V_{NS1}=V_{res}(Z)C_{bank}/(C_{NS1}+C_{bank})$$

While switch 502 is closed, $$C_{NS1}V_{NS1}(n)+C_{NS2}V_{int}(n-1)=(C_{NS1}+C_{NS2})V_{int}(n),$$

which results in $$V_{int}(z)=V_{res}(z)a(1-a)/(1-(1-a)z^{-1}),$$

or $$V_{res}(z)=V_{input}(z)D_{out}(z).$$

Combining the above yields $$D_{out}(z)=V_{input}(z)+Q(z)(1-z^{-1}(1-a))/(1+(1-a)(\kappa a-1)z^{-1}).$$

If $\kappa=1/a$, the pole is removed and first order noise shaping is realized. The zero is located at 1−a, and $a=C_{NS1}/(C_{NS1}+C_{bank})$ Values as $C_{NS2}=C_{bank}=C$ and $C_{NS1}=C/3$ entails $a=\frac{1}{4}$ and zero located at 0.75. A bode-plot for this example can show that the implementation has a noise transfer function of −12 dB at low frequencies; resulting in about 12 dB reduction of the quantization noise—depending on bandwidth.

Figure 6:
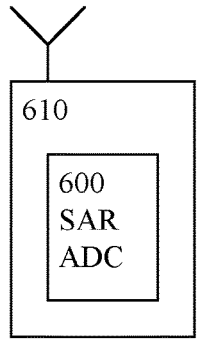
FIG. 6 is a schematic block diagram illustrating an example apparatus according to some embodiments.

FIG. 6 schematically illustrates an example apparatus 610 according to some embodiments. The apparatus comprises a SAR ADC 600 (e.g., any of the SAR ADCs described in connection with FIGS. 2 and 5). The apparatus 610 may, for example, be a receiver or a wireless communication device (e.g., a user device—such as a user equipment, UE, or a station, STA—or a network node—such as a base station, BS, or an access point, AP).

Figure 7:
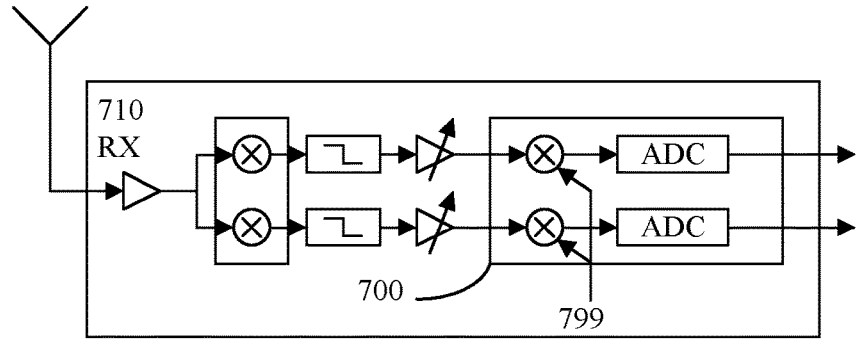
FIG. 7 is a schematic block diagram illustrating an example receiver according to some embodiments.

FIG. 7 schematically illustrates an example receiver (RX) 710 according to some embodiments. The apparatus comprises a SAR ADC 700 (e.g., any of the SAR ADCs described in connection with FIGS. 2 and 5) which implements mixing with an oscillator signal 799, wherein the mixing functionality is embedded within the analog-to-digital conversion as described otherwise herein.

Figure 8:
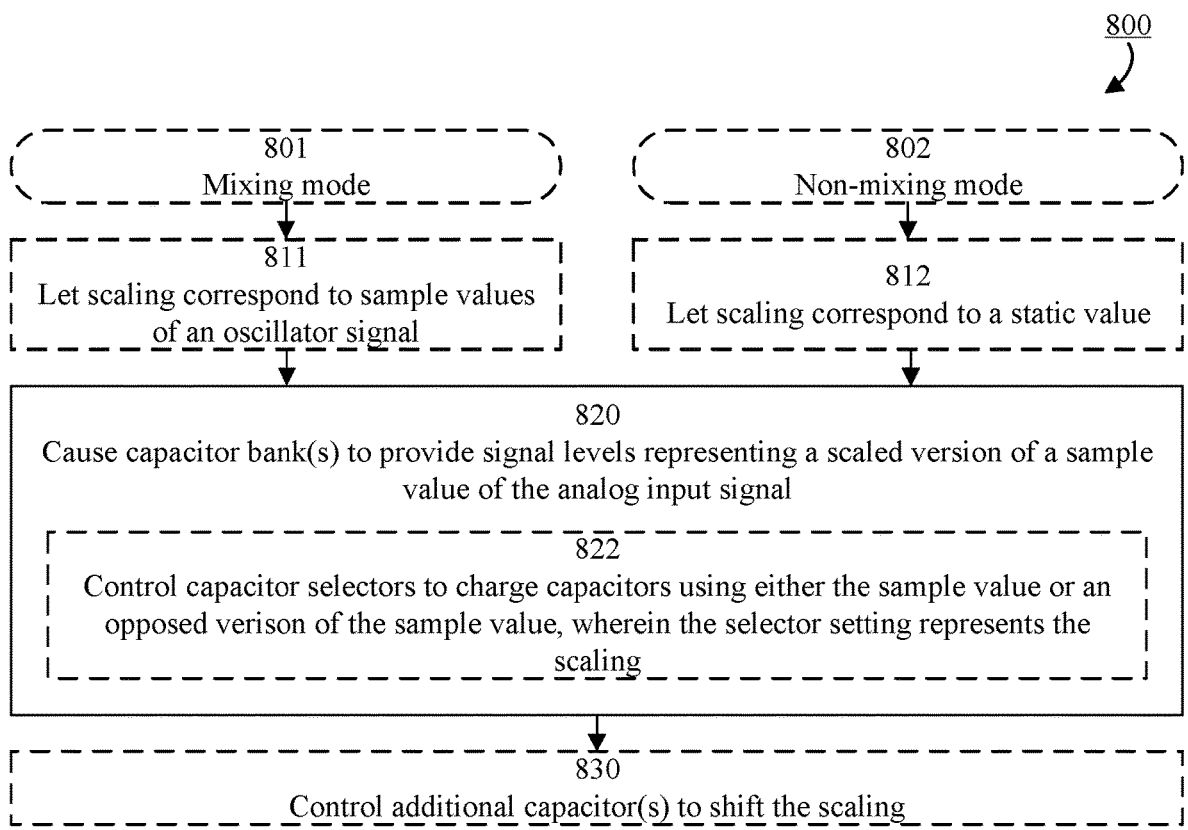
FIG. 8 is a flowchart illustrating example method steps according to some embodiments.

FIG. 8 illustrates an example method 800 according to some embodiments. The method 800 is for operating a SAR ADC (e.g., any of the SAR ADCs described in connection with FIGS. 2 and 5).

As illustrated by step 820, the method comprises causing the capacitor bank(s) to provide the plurality of signal levels for the comparator as representing a dynamically scaled version of the sample value of the analog input signal. This may be achieved by controlling a respective selector of each capacitor of the capacitor bank(s) to charge the capacitor using either the sample value of the analog input signal or the sample value of the opposed version of the analog input signal, as illustrated by optional sub-step 822. Typically, the respective selectors are set to correspond to a digital representation of the scaling value.

The SAR ADC may be operated in either a mixing mode or a non-mixing mode according to some embodiments, as illustrated by optional steps 801, 802.

When operated in the mixing mode, the scaling may correspond to sample values of an oscillator signal, as illustrated by optional step 811. Thus, the dynamically scaled version of the sample value of the analog input signal comprises a representation of the sample value of the analog input signal multiplied by a sample value of an oscillator signal.

When operated in the non-mixing mode, a static scaling value may be used, as illustrated by optional step 812.

If it is desirable to offset the quantization levels (e.g., to represent a zero-valued dynamically scaled sample of the analog input signal), the method may further comprise controlling additional capacitor(s) to shift the scaling of the sample value of the analog input signal, as illustrated by optional step 830.

Figure 9:
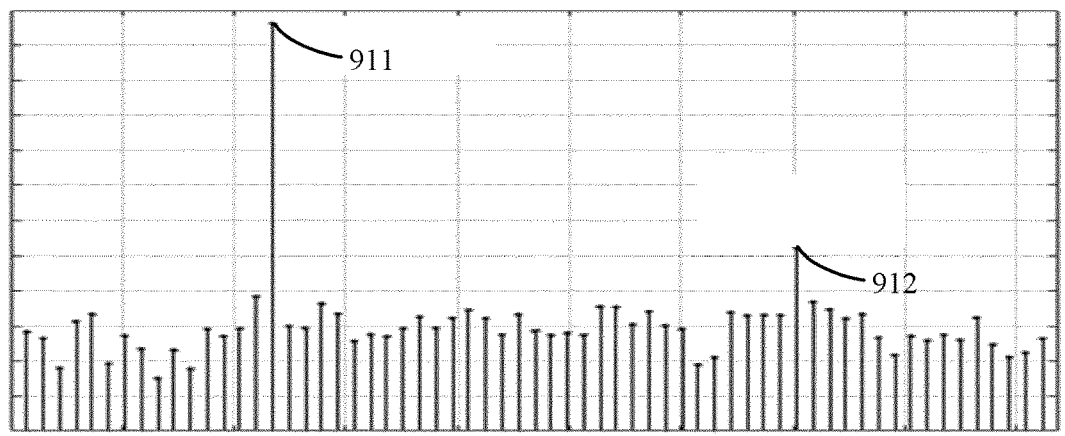
FIG. 9 is a collection of signal plots illustrating various principles and results according to some embodiments.
Figure 9:
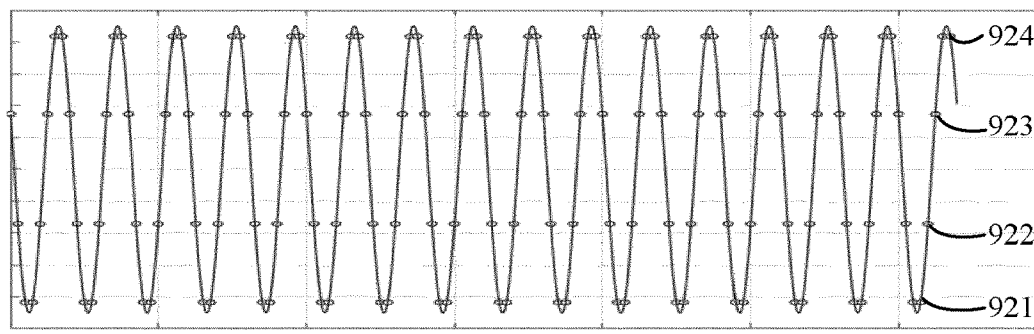
Figure 9:
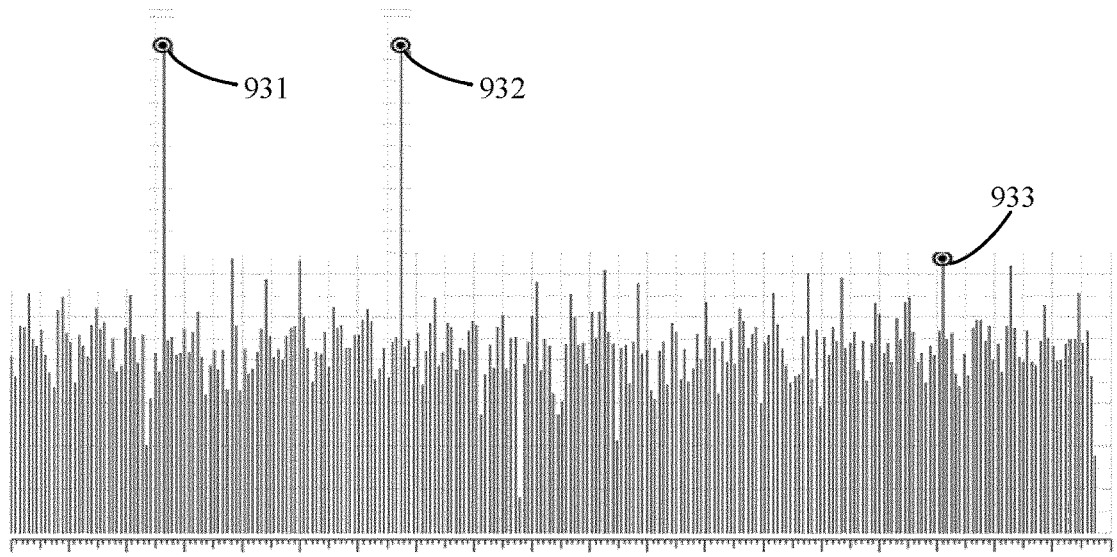

FIG. 9 is a collection of signal plots illustrating various principles and results according to some embodiments.

The technique according to some embodiments has been simulated using a state-of-the-art CMOS process design kit with critical components like switches and capacitors being represented by accurate electrical models. A 6-bit SAR ADC was implemented with functionality added to implement the approach presented herein: the additional capacitor 217, 227, the binary code generator 370, and the signal gating 380, 390 using the binary code generator output; but without noise shaping capabilities.

Parts (a) and (b) of FIG. 9 show the power spectral density and the sample points 921, 922, 923, 924 of the ADC output when the ADC input is a direct current (DC) signal. The sampling frequency is 375 MHz, $N_s=8$, and the synthesized LO frequency—corresponding to the frequency of the ADC output—is 375/8=46.875 MHz. For the plot of part (a), the x-axis ranges from 0 Hz to $18 \cdot 10^7$ Hz and the y-axis ranges from −120 dB to 0 dB. The power spectrum in part (a) shows that the third harmonic 912 is roughly 64 dB below the fundamental, desired, component 911.

The simulation was also performed for a 20.51 MHz sinusoidal input. The resulting ADC output frequencies becomes 46.875±20.51 MHz. Part (c) of FIG. 9 shows the power spectral density of the ADC output. The x-axis ranges from 0 Hz to $19 \cdot 10^7$ Hz and the y-axis ranges from −120 dB to 0 dB. The power spectrum in part (c) shows that the third harmonic 933 is well below the fundamental, desired, components 931, 932.

The described embodiments and their equivalents may be realized in hardware. For example, the embodiments may be performed by specialized circuitry, such as application specific integrated circuits (ASIC). The specialized circuitry may, for example, be associated with or comprised in an apparatus such as a wireless communication device (e.g., a user device or a network node).

Embodiments may appear within an electronic apparatus (such as a wireless communication device) comprising arrangements, circuitry, and/or logic according to any of the embodiments described herein. Alternatively or additionally, an electronic apparatus (such as a wireless communication device) may be configured to perform methods according to any of the embodiments described herein.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, the method embodiments described herein discloses example methods through steps being performed in a certain order. However, it is recognized that these sequences of events may take place in another order without departing from the scope of the claims. Furthermore, some method steps may be performed in parallel even though they have been described as being performed in sequence. Thus, the steps of any methods disclosed herein do not have to be performed in the exact order disclosed, unless a step is explicitly described as following or preceding another step and/or where it is implicit that a step must follow or precede another step.

In the same manner, it should be noted that in the description of embodiments, the partition of functional blocks into particular units is by no means intended as limiting. Contrarily, these partitions are merely examples.

Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. A successive approximation register (SAR) analog-to-digital converter (ADC) configured to receive an analog input signal and provide a digital output signal, the SAR ADC comprising:
   a capacitor bank for successively providing a plurality of signal levels based on a sample value of the analog input signal, wherein each signal level of the plurality is an indicator for a corresponding bit in a corresponding sample of the digital output signal; and
   controlling circuitry configured to cause the capacitor bank to provide the plurality of signal levels representing a dynamically scaled version of the sample value of the analog input signal, by dynamically controlling a respective selector of each capacitor of the capacitor bank to charge the capacitor using either the sample value of the analog input signal or an opposed version of the sample value of the analog input signal;
   wherein a setting of the respective selectors corresponds to a digital representation of a scaling value for the dynamically scaled version of the sample value of the analog input signal.

2. The SAR ADC of claim 1, wherein each sample of the digital output signal is a quantized representation of the corresponding sample of the dynamically scaled version of the sample value of the analog input signal.

3. The SAR ADC of claim 1, wherein the dynamically scaled version of the sample value of the analog input signal represents the sample value of the analog input signal multiplied by a sample value of an oscillator signal.

4. The SAR ADC of claim 3, wherein each sample of the digital output signal is a quantized representation of a corresponding sample of the analog input signal mixed with the oscillator signal.

5. The SAR ADC of claim 3, wherein the oscillator signal is a sinusoid signal.

6. The SAR ADC of claim 3, wherein a collection of sample values of the oscillator signal comprises at least three distinct values.

7. The SAR ADC of claim 1, further comprising a comparator configured to determine a bit value of the digital output signal based on a corresponding signal level provided by the capacitor bank.

8. The SAR ADC of claim 1, wherein each capacitor of the capacitor bank has a capacitance which equals a base capacitance multiplied by two to the power of a non-negative integer.

9. The SAR ADC of claim 8, wherein the capacitors of the capacitor bank have different capacitances, the capacitances including the base capacitance and successively increasing by a factor of two.

10. A successive approximation register (SAR) analog-to-digital converter (ADC) configured to receive an analog input signal and provide a digital output signal, the SAR ADC comprising:
- a capacitor bank for successively providing a plurality of signal levels based on a sample value of the analog input signal, wherein each signal level of the plurality is an indicator for a corresponding bit in a corresponding sample of the digital output signal;
- controlling circuitry configured to cause the capacitor bank to provide the plurality of signal levels representing a dynamically scaled version of the sample value of the analog input signal; and
- an additional capacitor controllable to shift the scaling of the sample value of the analog input signal.

11. The SAR ADC of claim 10, wherein the controlling circuitry is configured to control a selector of the additional capacitor to charge the additional capacitor using either the sample value of the analog input signal or the sample value of the opposed version of the analog input signal.

12. The SAR ADC of claim 10, wherein each capacitor of the capacitor bank has a capacitance which equals a base capacitance multiplied by two to the power of a non-negative integer, and wherein the additional capacitor has the base capacitance.

13. The SAR ADC of claim 10, wherein the controlling circuitry is configured to cause operation in either a mixing mode or a non-mixing mode, wherein operation in non-mixing mode is caused by application of a static scaling value.

14. The SAR ADC of claim 10, comprising first and second capacitor banks configured to successively provide first and second signal levels, wherein the first and second signal levels are differential signal levels for determination of the digital output signal.

15. The SAR ADC of claim 14, comprising first and second additional capacitors, wherein the controlling circuitry is configured to control a first selector of the first additional capacitor to charge the first additional capacitor using the sample value of the opposed version of the analog input signal and a second selector of the second additional capacitor to charge the second additional capacitor using the sample value of the analog input signal.

16. The SAR ADC of claim 10, further comprising a noise shaping network configured to provide an integration of the signal levels provided by the capacitor bank for adjustment of the digital output signal.

17. The SAR ADC claim of 10,
- wherein the controlling circuitry is configured to dynamically control a respective selector of each capacitor of the capacitor bank to charge the capacitor using either the sample value of the analog input signal or an opposed version of the sample value of the analog input signal; and
- wherein a setting of the respective selectors corresponds to a digital representation of a scaling value for the dynamically scaled version of the sample value of the analog input signal.

18. The SAR DAC of claim 1, further comprising:
- an additional capacitor controllable to shift the scaling of the sample value of the analog input signal.

19. A wireless communication device comprising:
- a successive approximation register (SAR) analog-to-digital converter (ADC) configured to receive an analog input signal and provide a digital output signal, the SAR ADC comprising:
- a capacitor bank for successively providing a plurality of signal levels based on a sample value of the analog input signal, wherein each signal level of the plurality is an indicator for a corresponding bit in a corresponding sample of the digital output signal; and
- controlling circuitry configured to cause the capacitor bank to provide the plurality of signal levels representing a dynamically scaled version of the sample value of the analog input signal, by dynamically controlling a respective selector of each capacitor of the capacitor bank to charge the capacitor using either the sample value of the analog input signal or an opposed version of the sample value of the analog input signal;
- wherein a setting of the respective selectors corresponds to a digital representation of a scaling value for the dynamically scaled version of the sample value of the analog input signal.

* * * * *